(12) United States Patent
Liu et al.

(10) Patent No.: US 11,403,870 B2
(45) Date of Patent: Aug. 2, 2022

(54) FINGERPRINT IDENTIFICATION APPARATUS AND ELECTRONIC DEVICE

(71) Applicant: SHENZHEN GOODIX TECHNOLOGY CO., LTD., Shenzhen (CN)

(72) Inventors: Chenjin Liu, Shenzhen (CN); Jianxiang Zhang, Shenzhen (CN); Baoquan Wu, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/362,608

(22) Filed: Jun. 29, 2021

(65) Prior Publication Data

US 2021/0326570 A1    Oct. 21, 2021

Related U.S. Application Data

(63) Continuation of application No. PCT/CN2019/112361, filed on Oct. 21, 2019.

(51) Int. Cl.
*G06V 40/13* (2022.01)
*G06V 40/12* (2022.01)

(52) U.S. Cl.
CPC ...... *G06V 40/1329* (2022.01); *G06V 40/1318* (2022.01); *G06V 40/1365* (2022.01)

(58) Field of Classification Search
None
See application file for complete search history.

(56) References Cited

U.S. PATENT DOCUMENTS

| | | | |
|---|---|---|---|
| 9,832,402 B2 | 11/2017 | Elikhis et al. | |
| 10,593,719 B2 | 3/2020 | Park et al. | |
| 2017/0126999 A1 | 5/2017 | Elikhis et al. | |
| 2017/0162620 A1 | 6/2017 | Wang et al. | |
| 2018/0114048 A1 | 4/2018 | Wang et al. | |
| 2018/0121705 A1* | 5/2018 | Oganesian | G06V 40/1318 |
| 2018/0301494 A1 | 10/2018 | Park et al. | |
| 2018/0307342 A1 | 10/2018 | Masoud et al. | |

(Continued)

FOREIGN PATENT DOCUMENTS

| | | |
|---|---|---|
| CN | 104850840 A | 8/2015 |
| CN | 107820618 A | 3/2018 |

(Continued)

*Primary Examiner* — Joseph R Haley (57) ABSTRACT

A fingerprint identification apparatus and an electronic device are provided. The fingerprint identification apparatus is used to be disposed under a display screen of an electronic device, including: a sensor chip, where the sensor chip includes a light detecting array and a chip seal ring, and the chip seal ring is disposed around the light detecting array; a light shielding layer, formed on the light detecting array, where the light shielding layer is provided with a plurality of light passing apertures, and the light shielding layer covers an whole region of the light detecting array and at least covers partial region of the chip seal ring; and the fingerprint light signal, returned after reflection or scattering via a finger above the display screen, is transmitted to the light detecting array through the plurality of light passing apertures on the light shielding layer for fingerprint identification.

20 Claims, 5 Drawing Sheets

(56) References Cited

U.S. PATENT DOCUMENTS

2019/0348457 A1 11/2019 Park et al.
2020/0327296 A1 10/2020 Wu et al.

FOREIGN PATENT DOCUMENTS

| CN | 108881750 A | 11/2018 |
| CN | 208092775 U | 11/2018 |
| CN | 208848221 U | 5/2019 |
| CN | 110088768 A | 8/2019 |
| CN | 110097821 A | 8/2019 |

* cited by examiner

FIG. 9

FINGERPRINT IDENTIFICATION APPARATUS AND ELECTRONIC DEVICE

CROSS-REFERENCE TO RELATED APPLICATIONS

This application is a continuation of International Application No. PCT/CN2019/112361, filed on Oct. 21, 2019, the disclosure of which is hereby incorporated by reference in its entirety.

TECHNICAL FIELD

The present application relates to the field of optical fingerprint technologies, and in particular, to a fingerprint identification apparatus and an electronic device.

BACKGROUND

With the advent of the era of a full-screen mobile phone, the application of an under-display fingerprint identification apparatus is more and more widely used, among which an under-display optical fingerprint identification apparatus is most popular. At present, the under-display optical fingerprint identification apparatus that enjoys mass production in the industry mainly adopts two schemes. One is to adopt a small aperture imaging scheme. In actual industrial production, the size of the small aperture cannot be further reduced, thereby limiting improvement of resolution of a fingerprint image. Besides, the small aperture only allows incident light in the perpendicular direction to enter, failing to provide sufficient light which causes a relatively limited imaging signal, and affecting the quality of the fingerprint image. The other is to adopt an optical lens scheme, which uses a spherical or aspherical lens for converging light and imaging. Under the trend of sliming the mobile phone, there is a shorter distance from a finger-pressing screen surface of the mobile phone to a fingerprint acquisition region of an optical chip, and a total optical thickness of the optical lens is smaller. Therefore, a fingerprint acquisition area of the scheme is very limited, failing to perform a large-area fingerprint acquisition, which affects performance of the fingerprint identification apparatus.

Therefore, how to improve the performance of the under-display optical fingerprint identification apparatus becomes an urgent problem to be solved.

SUMMARY

An embodiment of the present application provides a fingerprint identification apparatus and an electronic device, which may improve performance of the fingerprint identification apparatus.

In a first aspect, a fingerprint identification apparatus is provided, where the fingerprint identification apparatus is configured to be disposed under a display screen of an electronic device, including:
  a sensor chip, including a light detecting array and a chip protection ring, and the chip protection ring is disposed around the light detecting array;
  a light shielding layer, formed on the light detecting array, where the light shielding layer is provided with a plurality of light passing apertures, and the light shielding layer covers an whole region of the light detecting array and at least covers a partial region of the chip protection ring;
  wherein the fingerprint light signal, returned after reflection or scattering via a finger above the display screen, is transmitted to the light detecting array through the plurality of light passing apertures of the light shielding layer for fingerprint identification.

In a solution of an embodiment of the present application, the fingerprint light signal is transmitted to the light detecting array through the plurality of light passing apertures of the light shielding layer for fingerprint identification, which can achieve a large-area and high-resolution fingerprint identification image. In addition, the means of covering the chip protection ring with the light shielding layer, avoiding interference of a stray light signal on fingerprint identification and preventing the light signal reflected by the fingerprint identification apparatus from being transmitted to the outside of the display screen and being received by human eyes, while the performance of the fingerprint identification apparatus is improved, problems of the appearance of the fingerprint identification apparatus may also be solved.

In a possible implementation manner, the fingerprint identification apparatus further includes: a micro-lens array, disposed above the light shielding layer; where the micro-lens array is configured to converge the fingerprint light signal to the plurality of light passing apertures of the light shielding layer, and the fingerprint light signal is transmitted through the plurality of light passing apertures to the light detecting array.

In a solution of an embodiment of the present application, the micro-lens array converges the fingerprint light signal to the plurality of light passing apertures of the light shielding layer, and the fingerprint light signal is transmitted through the plurality of light passing apertures to the light detecting array for fingerprint identification, which can achieve a large-area and high-resolution fingerprint identification image as well as reduce a thickness of the fingerprint identification apparatus.

In a possible implementation manner, the fingerprint identification apparatus further includes: a filter layer, disposed between the light shielding layer and the sensor chip, is configured to filter out a light signal in a non-target waveband and transmit a light signal in a target waveband, and the filter layer covers the whole region of the light detecting array and at least covers the partial region of the chip seal ring.

In a solution of the embodiment of the present application, the filter layer covers the partial region of the chip protection ring, such that while the filter layer completely covers the light detecting array, an edge of the filter layer is relatively far from the light detecting array, and process problems of the edge of the filter layer will not affect the fingerprint light signal received by the light detecting array, thereby further improving the performance of the fingerprint identification apparatus.

In a possible implementation manner, the chip protection ring further includes: a chip welding region, including a plurality of chip welding pads; where the chip protection ring is a polygon ring-shaped structure, and the chip welding region is located in the chip protection ring and closer to a first side of the chip protection ring;
  and the light shielding layer does not cover the chip welding region and the first side of the chip protection ring.

In a possible implementation manner, the chip protection ring is a quadrilateral ring-shaped structure, and the light shielding layer covers at least one side apart from the first side of the chip protection ring.

In a possible implementation manner, the f filter layer does not cover the chip welding region and the first side of the chip protection ring.

In a possible implementation manner, the chip protection ring is a quadrilateral ring-shaped structure, and the filter layer covers at least one side apart from the first side of the chip protection ring.

In a possible implementation manner, the light shielding layer covers a partial region of a scribe line of the sensor chip.

In a possible implementation manner, the filter layer covers the partial region of the scribe line of the sensor chip.

In a possible implementation manner, the light shielding layer is one of a plurality light shielding layers, and at least one light shielding layer of the plurality of light shielding layers covers the whole region of the light detecting array and at least covers the partial region of the chip protection ring.

In a possible implementation manner, the filter layer is a filter material film formed on the light detecting array, and the filter layer and the light detecting array are integrated in the sensor chip.

In a possible implementation manner, the filter layer covers the whole region of the light detecting array, and a distance between a boundary of the filter layer and a boundary of the light detecting array is greater than 150 µm.

In a possible implementation manner, a thickness of the filter layer is between 1 µm to 10 µm, and a wavelength range of a target band ranges from 400 µm to 650 µm.

In a possible implementation manner, the filter layer comprises a plurality of oxide films, wherein a silicon oxide film and a titanic oxide film overlap in sequence to form the plurality of oxide films, or a silicon oxide film and a niobiun oxide film overlap in sequence to form the plurality of oxide films.

In a possible implementation manner, the light shielding layer has a transmittance of less than 8% for visible light at a wavelength range from 400 nm to 600 nm.

In a possible implementation manner, the fingerprint identification apparatus further includes:
  a surface blocking layer, formed on the light shielding layer and provided with an opening window, and the micro-lens array being disposed in the opening window;
  and the surface blocking layer is configured to block a light signal around the micro-lens array from entering the light detecting array.

In a solution of an embodiment of the present application, the surface blocking layer is used to block the light signal around the micro-lens array from entering the light detecting array as well as prevent the light signal reflected by the fingerprint identification apparatus from being transmitted to the display screen and being received by human eyes. By means of disposing the surface blocking layer, the interference of the stray light signal for fingerprint identification may be further avoided, problems of the appearance of the fingerprint identification apparatus may also be solve, thereby further improving the performance of the fingerprint identification apparatus.

In a possible implementation manner, an edge of the surface blocking layer covers an edge of the light shielding layer and/or an edge of the filter layer.

In a possible implementation manner, the surface light blocking layer has a transmittance of less than 8% for visible light at a wavelength range from 400 nm to 600 nm.

In a possible implementation manner, the fingerprint identification apparatus further includes: a first dielectric layer and a second dielectric layer;
  the first dielectric layer grows on a surface of the filter layer;
  the light shielding layer grows on a surface of the first dielectric layer;
  and the second dielectric layer grows on a surface of the light shielding layer and fills the plurality of light passing apertures of the light shielding layer.

In a possible implementation manner, each micro lens in the micro-lens array is a quadrilateral micro lens or a round micro lens.

In a possible implementation manner, an upper surface of each micro lens in the micro-lens array is a spherical surface or an aspherical surface.

In a possible implementation manner, the fingerprint light signal is a vertical oriented light signal perpendicular to the display screen or a specific oriented light signal obliquely to the display screen.

In a second aspect, an electrode device is provided, including a display screen and the fingerprint identification apparatus in the first aspect or any one of possible implementation manners of the first aspect.

In a possible implementation manner, the display screen is an organic light-emitting diode display screen, and a light-emitting layer of the display screen includes a plurality of organic light-emitting diode light sources, where the fingerprint identification device adopts at least part of the organic light-emitting diode light sources as excitation light sources for fingerprint identification.

By deploying the foregoing fingerprint identification apparatus in the electronic device, the electronic device is made to have a good fingerprint identification performance and improve a success rate of the fingerprint identification and user experience.

DESCRIPTION OF EMBODIMENTS

Technical solutions of embodiments of the present application is hereinafter described with reference to the accompanying drawings.

It should be understood that embodiments of the present application could be applied to an optical fingerprint system, including, but not limiting to an optical fingerprint recognition system and a product based on optical fingerprint imaging. Embodiments of the present application is merely described by taking the optical fingerprint system as an example but not intended to impose any limitation on embodiments of the present application. Besides, embodiments of the present application is also applicable to other systems adopting the technology of optical imaging.

As a common application scenarios, an optical fingerprint system provided by the embodiments of the present application can be applied to a smart phone, a tablet computer and another mobile terminal having a display screen or another electronic device; and more particularly, in the foregoing electronic devices, a fingerprint identification apparatus may specifically be an optical fingerprint apparatus, which may be disposed in a partial region or an whole region under a display screen, thereby forming an under-display optical fingerprint system. Alternatively, the fingerprint identification apparatus may be partially or entirely integrated in the interior of the display screen of the electronic device to form an in-display optical fingerprint system.

Figure 1:
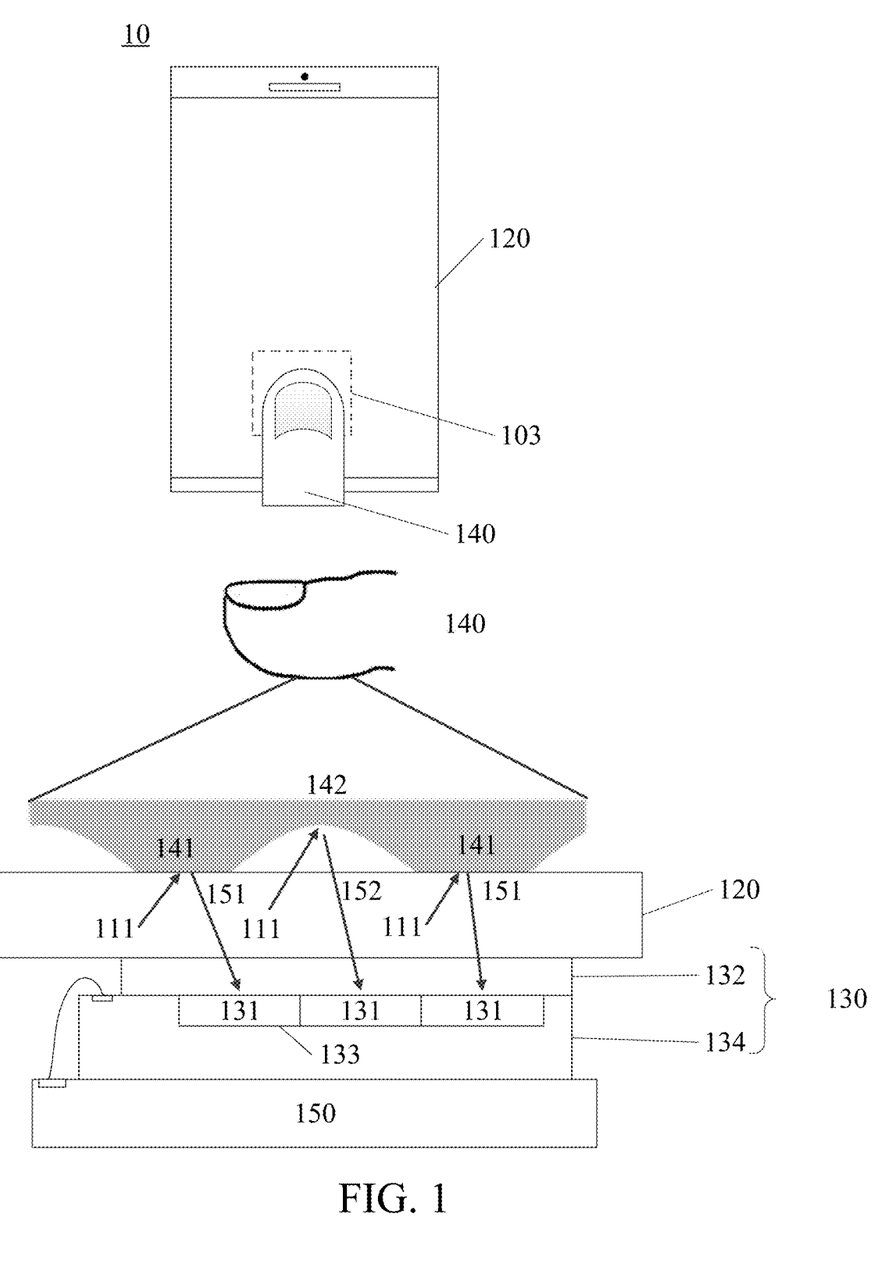
FIG. 1 is a schematic structural diagram of an electronic device applicable to an embodiment of the present application.

FIG. 1 illustrates a schematic structural diagram of an electronic device applicable to an embodiment of the present application. An electronic device 10 includes a display screen 120 and an optical fingerprint apparatus 130, where the optical fingerprint apparatus 130 is disposed in a partial region under the display screen 120. The optical fingerprint apparatus 130 includes an optical fingerprint sensor. The optical fingerprint sensor includes a sensing array 133 having a plurality of optical sensing units 131, and a region where the sensing array 133 is located or a sensing region thereof is a fingerprint detecting region 103 of the optical fingerprint apparatus 130. As shown in FIG. 1, the fingerprint detecting region 103 is located in a display region of the display screen 120. In an alternative embodiment, the optical fingerprint apparatus 130 may also be disposed at other positions, such as a side of the display screen 120 or non-light transmitting region at an edge of the electronic device 10, and a light signal of at least part of the display region of the display screen 120 is directed to optical fingerprint apparatus 130 through a light path design, such that fingerprint detecting region 103 is actually located in the display region of the display screen 120.

It should be understood that an area of the fingerprint detecting region 103 of the optical fingerprint apparatus 130 may be different from an area of the sensing array of the optical fingerprint apparatus 130. For example, through a lens imaging light path design, a reflective folding light path design or other light path designs such as light convergence or reflection so that the area of the fingerprint detecting region 103 of the optical fingerprint apparatus 130 is larger than the area of the sensing array of the optical fingerprint apparatus 130. In other alternative implementation manners, if the light path is directed in a manner of, for example, light collimation, the area of the fingerprint detecting region 103 of the optical fingerprint apparatus 130 may also be designed to be substantially identical with the area of the sensing array of the optical fingerprint apparatus 130.

Therefore, when a user needs to unlock electronic device or perform other fingerprint verification, a fingerprint input can be implemented merely by pressing a finger on the fingerprint detecting region 103 in display screen 120. Since fingerprint detection may be implemented in the screen, there is no need to exclusively reserve space for a front surface of the electronic device 10 adopting the foregoing structure to set a fingerprint button (such as a Home button), so that a full screen solution may be adopted; that is, the display region of the display screen 120 may be substantially extended to an entire front surface of the electronic device 10.

As an alternative implementation manner, as shown in FIG. 1, the optical fingerprint apparatus 130 includes a light detecting portion 134 and an optical component 132. The light detecting portion 134 includes the sensing array, a readout circuit and other auxiliary circuits electrically connected to the sensing array, which is produced in a die by a semiconductor process such as an optical imaging chip or an optical fingerprint sensor; the sensing array is specifically a photo detector (Photo detector) array including a plurality of photo detectors distributed in an array, and the photo detectors may be used as the optical sensing unit as described above. The optical component 132 may be disposed on the sensing array of the light detecting portion 134, and may specifically include a light directing layer or a light path directing structure, and other optical elements, and the light directing layer or light path directing structure is mainly configured to direct reflected light reflected from a finger surface to the sensing array for optical detection.

In a specific implementation, the optical component 132 and light detecting portion 134 may be encapsulated in the same optical fingerprint component. For example, the optical component 132 and the light detecting portion 134 may be encapsulated in the same optical fingerprint chip, or the optical component 132 may be disposed outside a chip where the light detecting portion 134 is located, for example, the optical component 132 is attached on the chip, or part of elements of the optical component 132 are integrated into the chip.

There are various implementations for the light directing layer or light path directing structure of the optical component 132, for example, the light directing layer may be specifically a collimator layer produced on a semiconductor silicon wafer, which has a plurality of collimating units or micro-pore arrays, and the collimating unit may be specifically a hole. Light in the reflected light reflected from the finger that is vertically incident to the collimating unit may pass through the collimating unit and be received by the optical sensing unit under it, however, light with an excessive large incident angle is attenuated through multiple reflection inside the collimating unit, and therefore, each optical sensing unit may substantially only receive the reflected light reflected from a fingerprint pattern right above the optical sensing unit, and thus the sensing array may detect a fingerprint image of the finger.

In another embodiment, the light directing layer or the light path directing structure may also be an optical lens layer having one or more lens units, for example, a lens group composed of one or more aspheric lenses, for converging reflected light reflected from the finger to the sensing array of the light detecting portion 134 under it, so that the sensing array may perform imaging based on the reflected light so as to obtain the fingerprint image of the finger. Optionally, the optical lens layer may be provided with a pinhole in the optical path of the lens unit, and the pinhole may cooperate with the optical lens layer to expand the field of view of the optical fingerprint apparatus, to improve a fingerprint imaging effect of optical fingerprint apparatus 130.

In other embodiments, light directing layer or the light path directing structure may also specifically adopt a micro-lens layer having a micro-lens array constituted by a plurality of micro-lenses, which may be formed on the sensing array of light detecting portion 134 by a semiconductor growth process or other processes, and each micro-lens may correspond to one of the sensing units in the sensing array respectively. Furthermore, other optical film layers such as a dielectric layer or a passivation layer, may be formed between the micro-lens layer and the sensing unit, and more specifically, a light blocking layer having a micro-pore may also be formed between the micro-lens layer and the sensing unit, where the micro-pore is formed between the corresponding micro-lens and sensing unit, and the light blocking layer may block optical interference between adjacent micro-lenses and the sensing units, such that light corresponding to the sensing unit is converged to the interior of the micro-pore through the micro-lens and is transmitted to the sensing unit via the micro-pore to perform optical fingerprint imaging. It should be understood that several implementations of the forgoing light path directing structure may be used alone or in combination, for example, a micro-lens layer may be further disposed under the collimator layer or optical lens layer. Certainly, when the collimator layer or optical lens layer is used in combination with the micro-lens layer, the specific laminated structure or light path may require to be adjusted according to actual needs.

As an optional embodiment, the display screen 120 may adopt a display screen with a self-emitting display unit, such as an organic light-emitting diode (OLED) display screen or a micro light-emitting diode (Micro-LED) display screen. In an example of an OLED display screen, optical fingerprint apparatus 130 may use display unit (that is, an OLED light source) located at the fingerprint detecting region 103 of the OLED display screen 120 as an excitation light source for optical fingerprint detection. When a finger 140 is pressed the fingerprint detecting region 103, the display screen 120 emits a beam of light 111 to the target finger 140 above the fingerprint detecting region 103, and the light 111 is reflected on a surface of the finger 140 to form reflected light or scattered light after scattering inside the finger 140. In related patent applications, the reflected light and scattered light are collectively referred to as reflected light for convenience of description. Since a ridge and a valley of a fingerprint have different light reflecting capabilities, reflected light 151 from the ridge of the fingerprint and the reflected light 152 from the valley of the fingerprint have different light intensities. After passing through the optical component 132, the reflected light is received by the sensing array 134 in the optical fingerprint apparatus 130 and converted into corresponding electrical signal, that is, a fingerprint detecting signal; and fingerprint image data may be obtained based on the fingerprint detecting signal, and fingerprint matching verification may be further performed, thereby implementing an optical fingerprint identification function at the electronic device 10.

In other embodiments, the optical fingerprint apparatus 130 may also use an internal light source or an external light source to provide a light signal for fingerprint detection. In this case, the optical fingerprint apparatus 130 may be applied to a non-self-emitting display screen, such as a liquid crystal display screen or other passive light-emitting display screens. Taking a liquid crystal display screen having a backlight module and a liquid crystal panel as an example, in order to support under-display fingerprint detection of the liquid crystal display screen, the optical fingerprint system of the electronic device 10 may further include an excitation light source for optical fingerprint detection. The excitation light source may specifically be an infrared light source or a light source of non-visible light with a specific wavelength, which may be disposed under the backlight module of the liquid crystal display screen or disposed in an edge region under a protective cover of the electronic device 10. The optical fingerprint apparatus 130 may be disposed under the liquid crystal panel or the edge region of the protective cover, and light for fingerprint detection may reach the optical fingerprint apparatus 130 by being directed by a light path. Alternatively, the optical fingerprint apparatus 130 may also be disposed under the backlight module, and the backlight module allows the light for fingerprint detection to pass through the liquid crystal panel and the backlight module and reach the optical fingerprint apparatus 130 by providing a hole on film layers such as a diffusion sheet, a brightening sheet, a reflection sheet or the like, or by performing other optical designs. When optical fingerprint apparatus 130 uses an internal light source or an external light source to provide a light signal for fingerprint detection, a detection principle is consistent with the foregoing description.

It should be understood that, in a specific implementation, electronic device 10 further includes a transparent protective cover; and the cover may be a glass cover or a sapphire cover, which is located on the display screen 120 and covers a front surface of the electronic device 10. Therefore, in an embodiment of the present application, the so-called finger pressing the display screen 120 actually refers to the finger pressing the cover on the display screen 120 or a surface of the protective layer covering the cover.

It should also be understood that, the electronic device 10 further includes a circuit board 150, and the circuit board is disposed under the optical fingerprint apparatus 130. The optical fingerprint apparatus 130 may be bonded to circuit board 150 by a backside adhesive, and electronic connection with circuit board 150 is achieved by a pad and a metal wire welding. The optical fingerprint apparatus 130 may achieve electrical interconnection and signal transmission with other peripheral circuits or other elements of the electronic device 10 through the circuit board 150. For example, the optical fingerprint apparatus 130 may receive a control signal of a processing unit of the electronic device 10 through the circuit board 150, and may also output a fingerprint detecting signal from the optical fingerprint apparatus 130 to the processing unit, a control unit and the like of the electronic device 10 through the circuit board 150.

On the other hand, in some embodiments, the optical fingerprint apparatus 130 may include only one optical fingerprint sensor, and in this case, the fingerprint detecting region 103 of the optical fingerprint apparatus 130 has a smaller area and a fixed position, therefore, when inputting the fingerprint, the user needs to press the finger to a specific position of the fingerprint detecting region 103, otherwise the optical fingerprint apparatus 130 may not be able to collect the fingerprint image, thereby resulting in poor user experience. In other alternative embodiments, optical fingerprint apparatus 130 may specifically include a plurality of optical fingerprint sensors which may be disposed under the display screen 120 side by side in a splicing manner, and sensing regions of the plurality of optical fingerprint sensors collectively constitute the fingerprint detecting region 103 of the optical fingerprint apparatus 130. In other words, the fingerprint detecting region 103 of the optical fingerprint apparatus 130 may include a plurality of sub-regions, each sub-region corresponding to a sensing region of one of the optical fingerprint sensors respectively, so that a fingerprint detecting region 103 of the optical fingerprint apparatus 130 may be extended to a main region of a lower portion of the display screen, that is, extended to a region that is generally pressed by a finger, thereby achieving a blind pressing type of a fingerprint input operation. Alternatively, when the number of optical fingerprint sensors is sufficient, the fingerprint detecting region 103 may also be extended to a half of the display region or even the entire display region, thereby achieving half-screen or full-screen fingerprint detection.

It should also be understood that, in an embodiment of the present application, the sensing array in the optical fingerprint apparatus may also be referred to as a pixel array, and the optical sensing unit or sensing unit in the sensing array may also be referred to as a pixel unit.

It should be noted that the optical fingerprint apparatus in an embodiment of the present application may also be referred to as an optical fingerprint identifying module, a fingerprint identifying apparatus, a fingerprint identifying module, a fingerprint module, a fingerprint acquisition apparatus, or the like, and the foregoing terms may be replaced with each other.

Due to requirements of large-area fingerprint identification, a high resolution fingerprint image, a sliming thickness and other factors, there is an increasing demand for a design of the optical fingerprint identification apparatus. An embodiment of the present application provides an improved optical fingerprint identification apparatus, which improves resolution of a fingerprint image while large-area fingerprint image acquisition is achieved, reduces the thickness of the fingerprint identification apparatus, and further improves performance of under-display optical fingerprint identification.

Hereinafter, the fingerprint identification apparatus according to an embodiment of the present application will be described in detail with reference to FIGS. 2 to 9.

It should be noted that in embodiments shown below, the same structures are denoted by the same reference signs for ease of understanding, and detailed description of the same structures is omitted for brevity.

Figure 2:
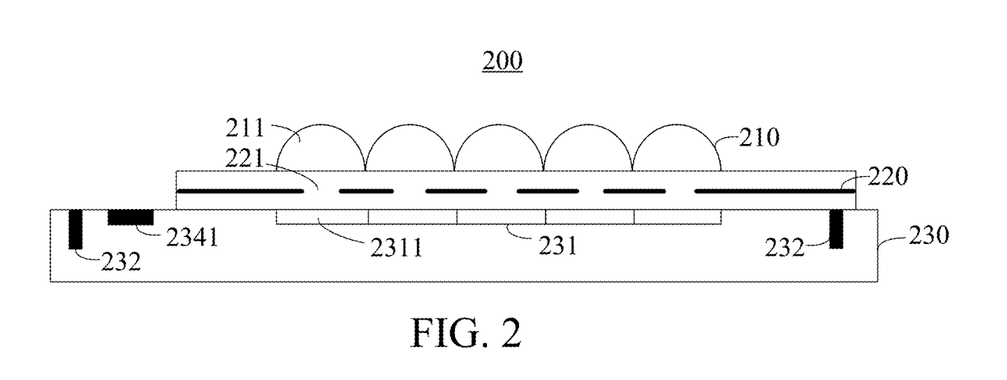
FIG. 2 is a schematic structural diagram of the fingerprint identification apparatus according to an embodiment of the present application.
Figure 3:
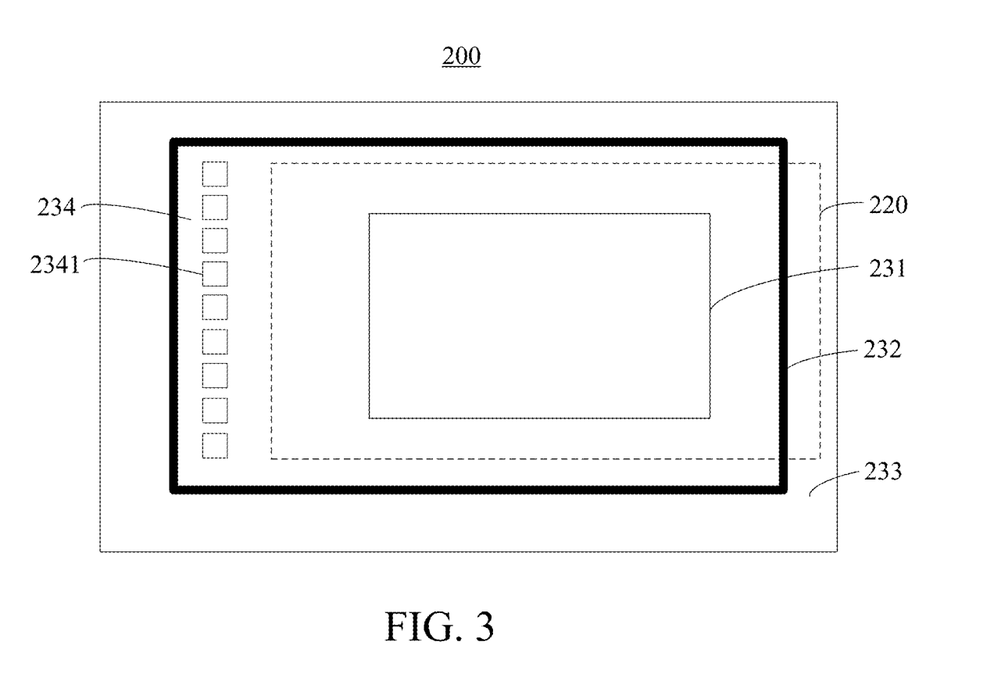
FIG. 3 is a schematic vertical view of the fingerprint identification apparatus in FIG. 2.

FIG. 2 is a schematic structural diagram of a fingerprint identification apparatus 200 provided in an embodiment of the present application. FIG. 3 is a schematic vertical view of the fingerprint identification apparatus 200 in FIG. 2. As shown in FIG. 2 and FIG. 3, the fingerprint identification apparatus 200 includes:
- a sensor chip 230, including a light detecting array 231 and a chip protection ring 232, where the chip protection ring 232 is disposed around the light detecting array 231;
- a light shielding layer 220, formed on the light detecting array 231, where the light shielding layer 220 is provided with a plurality of light passing apertures, and the light shielding layer 220 covers an whole region of the light detecting array 231 and at least covers a partial region of the chip protection ring 232;
- and the fingerprint light signal, returned after reflection or scattering via a finger above the display screen, is transmitted to the light detecting array 231 through the plurality of light passing apertures of the light shielding layer 220 for fingerprint identification.

Optionally, as shown in FIG. 2, the fingerprint identification apparatus 200 further includes: a micro-lens array 210, disposed above the light shielding layer 220;
where the micro-lens array 210 is configured to converge the fingerprint light signal returned after reflection or scattering via a finger above the display screen to the plurality of light passing apertures of the light shielding layer 220, and the fingerprint light signal is transmitted through the plurality of light passing apertures of the light shielding layer 220 to the light detecting array 231 for fingerprint identification.

Specifically, as shown in FIG. 2, the foregoing micro-lens array 210 includes a plurality of micro lens. The plurality of micro lens includes a first micro lens 211. The first micro lens 211 is configured to converge the fingerprint light signal above it to a first light passing aperture 221 under it, and the fingerprint light signal is transmitted to a first pixel unit 2311 in the light detecting array 231 through the first light passing aperture 221.

Optionally, the first micro lens 211 may be configured to converge a light signal above it and perpendicular to the display screen to the first light passing aperture 221.

Optionally, the first micro lens 211 may also be configured to converge a light signal above it and obliquely to the display screen to the first light passing aperture 221.

After the first pixel unit 2311 receives the fingerprint light signal, an electronic signal converted from it is configured to form a pixel in the fingerprint image.

Optionally, an upper surface of the first micro lens 211 may be a spherical surface or an aspherical surface.

Optionally, the first micro lens 211 is a polygon micro lens or a round micro lens. For example, when the first micro lens is a quadrilateral micro lens, an upper surface of the quadrilateral micro lens is a spherical surface or an aspherical surface, and a lower surface is quadrilateral.

Optionally, a material of the micro lens-array 210 is transparent medium, and a light transmittance of the transparent medium is greater than 99%, for example, the transparent medium is a resin, glass and like.

It should be understood that, the first micro lens 211 is an arbitrary one of the plurality of micro lenses in the micro-lens array 210. A shape and size of the plurality of micro lenses in the micro-lens array 210 may be identical with or different from that of the first micro lens 211. The embodiment of the present application does not limit the shape and size of the plurality of micro lenses.

Specifically, in an embodiment of the present application, the foregoing light shielding layer 220 completely covers the light detecting array 231 of the sensor chip 230. Specifically, the light shielding layer 220 may be prepared on the sensor chip 230 by applying a micro-Nano processing process or a Nano printing process. For example, the micro-Nano processing process is applied, by means of such as spin coating, spraying, atomic layer deposition, sputter coating, electron beam evaporation coating and ion beam coating, to prepare a layer or a plurality of layers of films of non-light transmitting material on the sensor chip 230, and then small-hole pattern lithography and etching are performed to form a plurality of light passing apertures. Optionally, the optical component 132 in FIG. 1 may include the foregoing micro-lens array 210 and light shielding layer 220.

Specifically, the light shielding layer 220 is configured to block ambient light, stray light and other light signals which interfere with fingerprint detection. For example, the light shielding layer 220 has a transmittance of light at a specific band (such as visible light or a band more than 610 nm) less than a certain threshold, and the corresponding light is prevented from passing. Optionally, a material of the light shielding layer 220 may be a metal or a black opaque material.

Optionally, in a possible implementation manner, the light shielding layer 220 has a transmittance of less than 8% for visible light with a wavelength range from 400 nm to 600 nm.

Optionally, the light passing aperture of the light shielding layer 220 may be a round aperture having a diameter less than 10 μm for optical imaging, and resolution of optical imaging may be improved by reducing a size of the light passing aperture, thereby improving resolution of the fingerprint image.

Optionally, the diameter of the light passing aperture may also be greater than a certain threshold, such that sufficient light signals are passed for imaging to improve imaging quality.

Optionally, as shown in FIG. 2, the plurality of light passing apertures of the light shielding layer 220 are arranged in an array, and each the light passing aperture corresponds to a micro lens in the micro-lens array.

Specifically, in an embodiment of the present application, the light detecting array 231 in the sensor chip 230 is configured to receive a fingerprint light signal passing through the micro-lens array 210 and the light shielding layer 220 and convert the fingerprint light signal into an electrical signal. Optionally, the light detecting array processes the electrical signal to obtain a fingerprint image signal for fingerprint identification.

Optionally, as shown in FIG. 2, the light detecting array 231 includes a plurality of pixel units. The pixel unit may include a photo diode (PD), a metal oxide semiconductor-field effect transistor (MOSFET) and like. Optionally, the pixel unit has high light sensitivity and high quantum efficiency with respect to light at a specific wavelength, so as to detect a light signal of a corresponding wavelength.

Optionally, the light detecting array 231 may be identical with the sensing array in the light detecting portion 134 in FIG. 1. In the sensor chip 230, besides the light detecting array 231, a function circuit further includes a readout circuit or other auxiliary circuit connected to the light detecting array 231, for implementing normal operation of the light detecting array 231, and reading and processing the fingerprint electronic signal formed by the light detecting array 231.

Specifically, a chip protection ring (Seal Ring) 232 in the sensor chip 230 is a ring-shaped structure piled with a metal layer, an oxide layer, a nitride layer and like, and disposed at an edge around the sensor chip 230. The function circuit in the sensor chip 230 is located in the chip protection ring 232, and a distance from the chip protection ring 232 to the function circuit is greater than a certain threshold, for example, a distance from an edge of light detecting array 231 in the sensor chip 230 to the chip protection ring 232 needs to be greater than a certain threshold. In addition, an outer region of the chip protection ring 232, that is, a scribe line (Scribe Line) on a wafer, and by scribing the scribe line on the wafer, the sensor chip 230 can be separated and obtained.

Optionally, as shown in FIG. 3, when the sensor chip 230 of the fingerprint identification apparatus 200 is a quadrilateral chip, the chip seal protection ring 232 in it may also be a quadrilateral ring-shaped structure, which can protect the function circuit in the chip. Specifically, the chip protection ring 232 may protect the chip from mechanical damage during scribing, and the chip protection ring 232 is grounded to prevent the chip from external interference and to prevent water vapor from the chip's cross section from entering the chip and causing the chip to work abnormally.

It should be understood that the chip protection ring 232 in the embodiment of the present application is identical with the chip protection ring (Seal Ring) in a chip in prior art, which can be implemented in a sensor chip by those skilled in the art through the prior art, the detailed technical solutions of which will not be repeated herein.

It should also be understood that, in the embodiment of the present application, the chip protection ring includes but not limited to a quadrilateral ring-shaped structure, and may also be other polygons or a round ring-shaped structure, and a form of the chip protection ring is related to a form of the chip, which is not limited by the embodiment of the present application.

For convenience of description, the ongoing description takes the sensor chip as a quadrilateral chip and the chip protection ring as a quadrilateral ring-shaped structure as an example. When the chip protection ring has other shape and structures, the specific solution can be referred to related description, which will not be repeated herein.

Specifically, in an embodiment of the present application, when the chip protection ring 232 is a polygon ring-shaped structure, the light shielding layer 220 covers the whole region of the light detecting array 231 and covers at least one side of the chip protection ring 232. For example, as shown in FIG. 2 and FIG. 3, the light shielding layer 220 cover a partial region of the right side of the chip protection ring 232.

In sensor chip 230, an outer region of the chip protection ring 232 is a scribe line 233. Optionally, an edge of the light shielding layer 220 may be located right on the chip protection ring and does not cover the scribe line 233 outside the chip protection ring 232.

Optionally, the edge of the light shielding layer 220 may also be located inclined above the chip protection ring, and covers at least one side of the chip protection ring as well as part of the scribe line 233 outside the chip protection ring 232.

For example, as shown in FIG. 3, when the light shielding layer 220 covers a partial region at the right side of the chip protection ring 232, the light shielding layer 220 also covers part of the scribe line region outside the right side of the chip protection ring 232. Similarly, when the light shielding layer 220 covers partial regions at other sides of the chip protection ring 232, correspondingly, the light shielding layer 220 also covers part of the scribe line region outside the other sides of the chip protection ring 232.

Optionally, when the fingerprint identification apparatus 200 includes a plurality of light shielding layers, the foregoing light shielding layer 200 is an arbitrary layer of the plurality of light shielding layers, and all of the plurality of light shielding layers are provided with a plurality of light passing apertures for transmitting the fingerprint light signal to the light detecting array. At least one light shielding layer of the plurality of light shielding layers covers a whole region of the foregoing light detecting array 231 and at least covers a partial region of the foregoing chip protection ring 232.

Optionally, all of the light shielding layers of the plurality of light shielding layers can cover the partial region of the chip protection ring 232. For example, when the chip protection ring has a polygon ring-shaped structure, all of the light shielding layers cover one side or a plurality of sides of the chip protection ring. Optionally, the plurality of light shielding layers may also have only one layer, for example, the forgoing light shielding layer 220 or part of the light shielding layer covers the partial region of the chip protection ring, which is not limited by the embodiment of the present application.

In a solution of an embodiment of the present application, the micro-lens array converges the fingerprint light signal to the plurality of light passing apertures of the light shielding layer, and the fingerprint light signal is transmitted through the plurality of light passing apertures to the light detecting array for fingerprint identification, which may implement identification for a large-area and high-resolution image as well as reduce the thickness of the fingerprint identification apparatus. In addition, by means of covering the chip protection ring with the light shielding layer, avoiding interference of a stray light signal on fingerprint identification and preventing the light signal reflected by the fingerprint identification apparatus from being transmitted to the outside of the display screen, it may improve the performance of the fingerprint identification apparatus as well as solve problems of the appearance of the fingerprint identification apparatus.

Optionally, the sensor chip 230 of the fingerprint identification apparatus 200 further includes a chip welding region 234, and the chip welding region 234 is provided with at least one chip welding pad 2341. The chip welding pad is used for electronic connection with other electrical apparatuses such as a circuit board and like, and transmits electrical signals generated by the light detecting array 230. In the embodiment of the present application, the chip welding region 234 is also a function circuit in the sensor chip 230 and is located in the chip protection ring 232.

Optionally, as shown in FIG. 2 and FIG. 3, the chip welding region 234 may be close to the left side of the chip protection ring 232 (an example of the first side of the chip seal ring). In this case, the light shielding layer 220 does not cover the chip welding region 234, and does not cover the left portion of the chip protection ring 232.

Optionally, as shown in FIG. 2 and FIG. 3 when the chip welding region 234 is arranged close to the left side of the chip protection ring 232, the light shielding layer 220 may only cover the right portion of the chip protection ring 232.

It should be understood that, in addition to the foregoing situations, the light shielding layer 220 may also cover any one side portion or any multiple side portions of the right side portion, the upper side portion, and the lower side portion of the chip protection ring 232. For example, the light shielding layer simultaneously covers the right portion, upper portion and lower portion of the chip protection ring 232.

It should also be understood that the chip welding region 234 can also be arranged close to a plurality sides of the chip protection ring. For example, the chip welding region 234 is arranged close to the left and upper sides of the chip protection ring 232. In this case, a plurality of chip welding pads 2341 are provided near the side and the upper side of the chip protection ring 232, and the light shielding layer 220 does not cover the left and upper portions of the chip protection ring, but only covers the lower portion and/or right portion of the chip protection ring.

Figure 4:
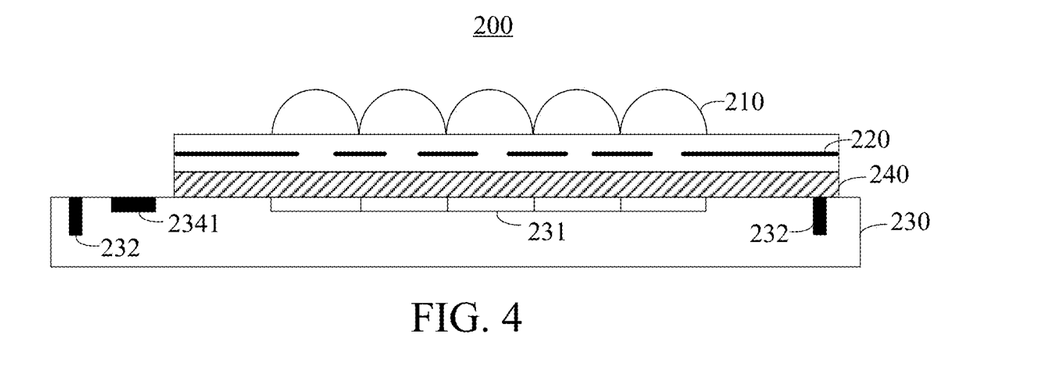
FIG. 4 is a schematic structural diagram of another fingerprint identification apparatus according to an embodiment of the present application.
Figure 5:
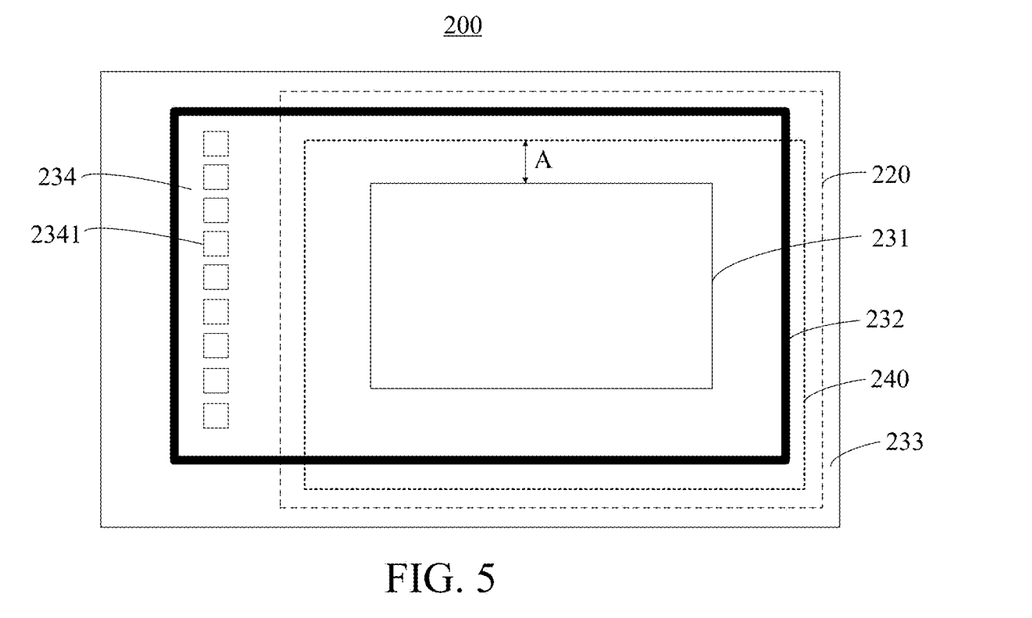
FIG. 5 is a schematic vertical view of the fingerprint identification apparatus in FIG. 4.

FIG. 4 shows a schematic structural diagram of another fingerprint identification apparatus 200, and FIG. 5 is a schematic vertical view of the fingerprint identification apparatus 200 in FIG. 4.

As shown in FIGS. 4 and 5, the fingerprint identification apparatus 200 further includes: a filter layer 240, and the filter layer 240 is disposed between the light shielding layer 220 and the sensor chip 230, and is configured to filter out light signals in a non-target waveband and pass through the light signal in the target waveband, which facilitates reduction of the influence of the light signal of the non-target waveband, thereby improving the performance of fingerprint identification.

Optionally, the filter layer 240 grows on the surface of the sensor chip 230 and is integrated in the sensor chip 230, and the filter layer 240 completely covers the light detecting array 231 in the sensor chip 230.

Specifically, a physical vapor deposition (PVD) process may be used to coat the plurality of pixel units of the sensor chip 230 to form the filter layer 240, for example, preparing a plurality of layer filter material films on the sensor chip 230 with methods such as atomic layer deposition, sputtering coating, electron beam evaporation coating, ion beam coating and like.

Optionally, in an embodiment of the present application, the filter layer 240 includes a plurality of oxide films, where the plurality of oxide films include a silicon oxide film and a titanic oxide film, and the silicon oxide film and the titanic oxide film grow in sequence to form the filter layer 240; or the plurality of oxide films include a silicon oxide film and a niobiun oxide film, and the silicon oxide film and the niobiun oxide film grow in sequence to form the filter layer 240.

Optionally, in an embodiment of the present application, a thickness of the filter layer 240 is between 1 μm to 10 μm.

Optionally, the filter layer 240 is configured to allow a light signal in a waveband range from 400 μm to 650 μm to pass through, in other words, a wavelength range of the target waveband includes 400 μm to 650 μm.

Optionally, in an embodiment of the present application, the filter layer 240 at least cover a partial region of the chip protection ring 232, such that while the filter layer 240 completely covers the light detecting array 231, the total area of the filter layer is relatively large and the edge of the filter layer is relatively far from the light detecting array 231. During the growth of the filter layer 240, due to the influence of the growth process and equipment, the edge region of the filter layer 240 will affect the quality of the material grown thereon, for example, affect the growth quality of the light shielding layer 220, or possibly affect the growth quality of the dielectric layer between the filter layer and the light shielding layer, thereby affecting the quality of the light signal received by the fingerprint detecting apparatus and the performance of the fingerprint detecting apparatus. Therefore, by a solution of the embodiment of the present application, the edge region of the filter layer 240 is relatively far from the light detecting array 231. Therefore, the process problem of the filter layer 240 will not affect the fingerprint light signal received by the light detecting array 231, thereby further improving the performance of the fingerprint identification apparatus.

Optionally, in a possible implementation manner, a distance between a boundary of the filter layer 240 and a boundary of the light detecting array 231 is greater than 150 μm. For example, in FIG. 5, the distance A between an upper boundary of the filter layer 240 and an upper boundary of the light detecting array 231 is greater than 150 μm. It should be noted herein that the boundary of the filter layer 240 is the boundary of the projection of the filter layer 240 on the sensor chip 230, and the distance between the boundary of the filter layer 240 and the boundary of the light detecting array 231 is the shortest distance between the two.

Optionally, as shown in FIG. 5, the filter layer 240 covers a partial region at the right side and at lower side of the chip protection ring 232. Optionally, the filter layer 240 may also cover any one side portion or any multiple side portions among the upper portion, the right portion, and the lower portion of the chip protection ring 232. For example, the filter layer 240 simultaneously covers the right portion, the upper portion, and the lower portion of the chip protection ring 232.

Optionally, the edge of the filter layer 240 may be located right on the chip protection ring and does not cover the scribe line 233 at outside of the chip protection ring 232.

Optionally, the edge of the filter layer 240 may also be located inclined on the chip protection ring, and covers the chip protection ring as well as part of the scribe line 233 at outside of the chip protection ring 232.

Optionally, when the filter layer 240 covers a partial region at the right side and lower side of the chip protection ring 232, the filter layer 240 also covers part of the scribe line region outside the right outside and lower side of the chip protection ring 232. Similarly, when the filter layer 240 covers partial regions at other sides of the chip protection ring 232, correspondingly, the filter layer 240 also covers part of the scribe line region outside the other sides of the chip protection ring 232.

Optionally, as shown in FIG. 5, the chip welding region 234 is also arranged close to the left region of the chip protection ring 232, and the filter layer 240 does not cover the chip welding region 234, nor does it cover the left region of the chip protection ring 232.

Similarly, when the chip welding region 234 is located close to another side or multiple sides of the chip protection ring 232, the filter layer 240 does not cover another side or multiple sides of the chip protection ring 232.

Figure 6:
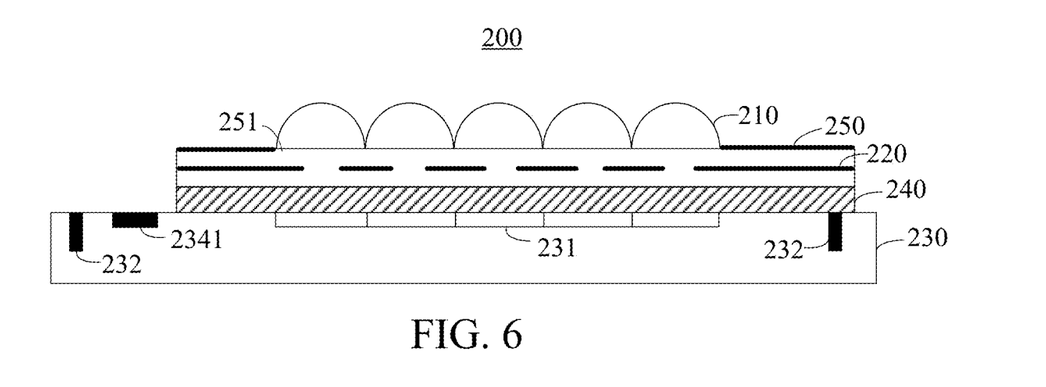
FIG. 6 is a schematic structural diagram of another fingerprint identification apparatus according to an embodiment of the present application.
Figure 7:
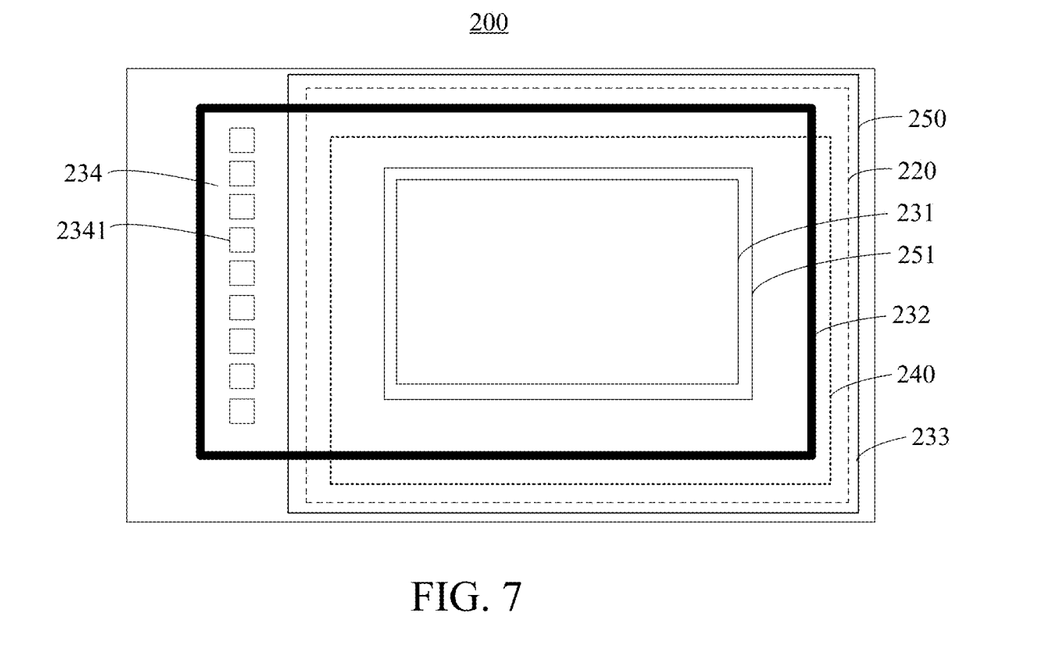
FIG. 7 is a schematic vertical view of the fingerprint identification apparatus in FIG. 6.

FIG. 6 shows a schematic structural diagram of another fingerprint identification apparatus 200, and FIG. 7 is a schematic vertical view of the fingerprint identification apparatus 200 in FIG. 6.

As shown in FIG. 6 and FIG. 7, the fingerprint identification apparatus 200 further includes: a surface light blocking layer 250 formed on the light shielding layer 220, the surface light blocking layer 250 is provided with an opening window 251, and the micro-lens array 210 is disposed in the opening window 251. Specifically, the surface light blocking layer 250 is configured to prevent the light signal around the micro-lens array 210 from entering the light detecting array 231, and preventing the light signal reflected by the fingerprint identification apparatus from being transmitted through the display screen and being received by human eyes. By providing the surface light blocking layer, it may further avoid interference of a stray light signal on fingerprint identification and solve problems of the appearance of the fingerprint identification apparatus, thereby further optimizing the performance of the fingerprint identification apparatus.

Optionally, in an embodiment of the present application, the edge of the surface light blocking layer 250 covers the edge of the light shielding layer 220 and/or the edge of the filter layer 240. Optionally, the edge of the surface light blocking layer 250 completely covers the edge of the light shielding layer 220 and/or the edge of the filter layer 240. Optionally, the edge of the surface light blocking layer 250 may also only cover a partial region of the light shielding layer and/or a partial region of the edge of the filter layer. For example, only three edges of the surface light blocking layer 250 cover the three edges corresponding to the light shielding layer 220, and the other edge does not cover the other edge corresponding to the light shielding layer 220.

As shown in FIG. 7, when the light shielding layer 220 covers a partial upper region, a partial lower region, and right side region of the chip protection ring 232, the edges of the surface light blocking layer 250 can cover the four edges of the light shielding layer 220, and at the same time, the surface light blocking layer also covers the partial upper region, the partial lower region, and the right side region of the chip protection ring 232, and covers part of the scribe line of the upper, lower, and right side of the sensor chip 230.

Optionally, as shown in FIG. 7, the surface light blocking layer 250 also simultaneously covers the four edges of the filter layer 240.

Specifically, in an embodiment of the present application, the surface light blocking layer 250 may be prepared on the sensor chip 230 by applying a micro-Nano processing process or a Nano printing process. For example, the micro-Nano processing process is applied, through methods such as spin coating, spraying, atomic layer deposition, sputter coating, electron beam evaporation coating and ion beam coating, to prepare a film of non-light transmitting material on the light shielding layer 220.

Specifically, the surface light blocking layer 250 also has a transmittance of light in a specific waveband (for example, visible light or a waveband over 610 nm) of less than a certain threshold, so as to prevent corresponding light from passing through. Optionally, a material of the surface light blocking layer may be a metal or a black opaque material.

Optionally, in a possible implementation manner, the surface light blocking layer has a transmittance of less than 8% for visible light in a wavelength range from 400 nm to 600 nm.

As shown in FIG. 6 and FIG. 7, the surface light blocking layer 250 is provided with an opening window 251. The area of the opening 251 is slightly larger than or equal to the area of the micro-lens array 210, so that the micro-lens array 210 can be disposed in the opening window 251.

Optionally, a transparent medium layer is disposed between the light shielding layer 220 and the micro-lens array 210, the surface light blocking layer 250 is disposed on the transparent medium layer, and the micro-lens array 210 is adhered to the transparent medium layer by an optically transparent adhesive bonding layer.

Figure 8:
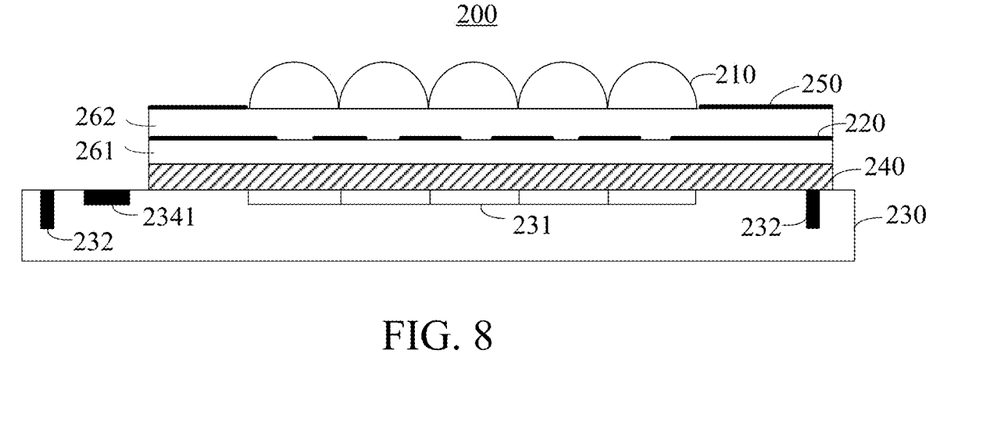
FIG. 8 is a schematic structural diagram of another fingerprint identification apparatus according to an embodiment of the present application.

Optionally, FIG. 8 shows a schematic structural diagram of another fingerprint identification apparatus.

As shown in FIG. 8, the fingerprint identification apparatus 200 further includes: a first dielectric layer 261 and a second dielectric layer 262;

The first dielectric layer 261 grows on a surface of the filter layer 240, the foregoing light shielding layer 220 grows on a surface of the first dielectric layer 261, the second dielectric layer 262 grows on a surface of the light shielding layer 220 and fills the plurality of light passing apertures of the light shielding layer 220, and the micro-lens array 210 and the surface blocking layer 250 are formed on a surface of the second dielectric layer 262.

Optionally, the first dielectric layer 261 and the second dielectric layer 262 may grow through a semiconductor process, for example, through coating methods such as atomic layer deposition, sputter coating, electron beam evaporation coating and ion beam coating to grow and prepare.

Optionally, the first dielectric layer 261 and second dielectric layer 262 are an organic transparent dielectric material or inorganic transparent dielectric material, such as resin or silicon oxide.

Optionally, the first dielectric layer 261 and the second dielectric 262 may also be an optical transparent adhesive bonding layer for connecting the micro-lens array 210, the light shielding layer 220 and the filter layer 240 and like.

Optionally, dielectric materials of the first dielectric layer 261 and second dielectric layer 262 are identical or different.

Optionally, the foregoing first light blocking layer 220, first dielectric layer 261 and second dielectric layer 262 are all integrated with the light detecting array 231 in the sensor chip 230. For example, the first dielectric layer 261 and the second dielectric layer 262 are both silicon oxide. First, the first dielectric layer 261 is formed on the filter layer 240. Then, the light blocking layer 220 is prepared on the first dielectric layer 261. Then, the second dielectric layer 262 is prepared on the light blocking layer 220.

It should be understood that the fingerprint identification apparatus 200 includes a plurality layer of light shielding layers, and a dielectric layer is disposed among the plurality layer of light shielding layers. The material of the dielectric layer may be as same as the foregoing first dielectric layer and the second dielectric layer, for connecting the adjacent two light shielding layers.

It should also be understood that the fingerprint identification apparatus 200 may further include a support structure component for supporting the fingerprint identification apparatus 200, and a corresponding processing chip and the like, which are not defined in an embodiment of the present application.

Figure 9:
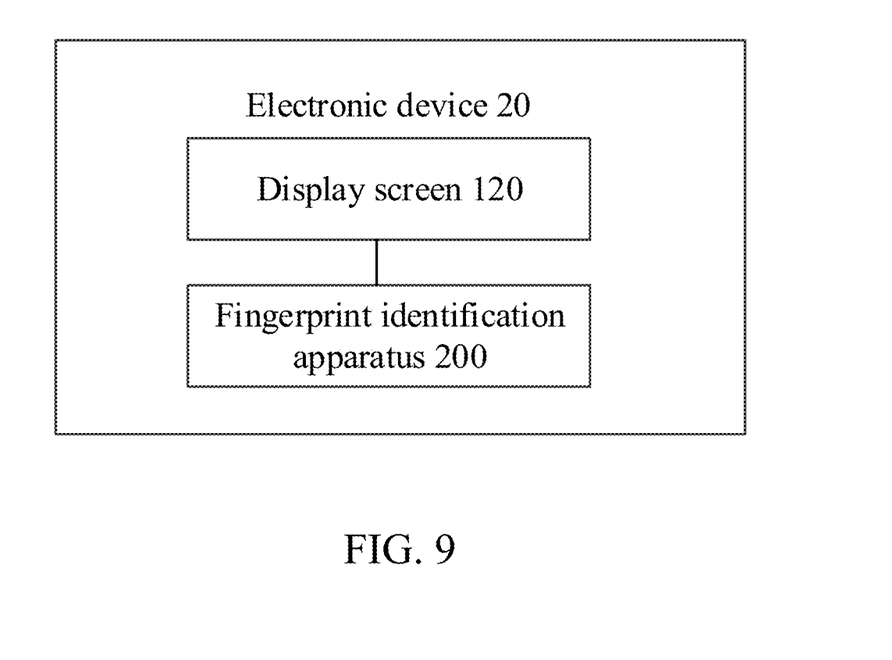
FIG. 9 is a schematic block diagram of an electronic device according to an embodiment of the present application.

As shown in FIG. 9, an embodiment of the present application further provides an electronic device 20, and the electronic device 20 may include the foregoing display screen 120 and the fingerprint identification apparatus 200 of the embodiments of the present application, where the fingerprint identification apparatus 20 is disposed under the display screen 120.

The electronic device may be any electronic device with a display screen.

Optionally, in an embodiment of the present application, the display screen 120 may be specifically a self-emitting display screen (such as an OLED display screen), and includes a plurality of self-emitting display units (such as OLED pixels or OLED light sources). When the optical image acquisition system is a biological feature recognition system, part of the self-emitting display unit in the display screen can be used as an excitation light source for the biological feature recognition system to perform biological feature recognition, and is used to emit light signals to the biological feature detecting region for use in biological features detection.

It should be appreciated that specific examples in embodiments of the present application are just for helping those skilled in the art better understand the embodiments of the present application, rather than for limiting the scope of the present application.

It should also be appreciated that terms used in embodiments of the present application and the claims appended hereto are merely for the purpose of describing particular embodiments, and are not intended to limit the embodiments of the present application. For example, the use of a singular form of "a", "the" and "said" in an embodiment of the present application and the claims appended hereto are also intended to include a plural form, unless otherwise clearly indicated herein by context.

Those of ordinary skill in the art may be aware that, units of the examples described in the embodiments disclosed in this paper may be implemented by electronic hardware, computer software, or a combination of the two. To clearly illustrate interchangeability between the hardware and the software, the foregoing illustration has generally described composition and steps of the examples according to functions. Whether these functions are executed by hardware or software depends on the specific application and constraints of design of the technical solution. Professionals can use different methods for each specific application to implement the described functions, but such implementation should not be considered beyond the scope of this application.

In the several embodiments provided in the present application, it should be understood that, the disclosed system and apparatus may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual coupling or direct coupling or communication connection may be indirect coupling or communication connection through some interfaces, apparatuses or units, and may also be electrical, mechanical, or connection in other forms.

The units described as separate parts may or may not be physically separate, and parts displayed as units may or may not be physical units, may be located in one position, or may be distributed on multiple network units. Part of or all of the units here may be selected according to a practical need to achieve the objectives of the solutions of the embodiments of the present application.

In addition, various functional units in the embodiments of the present application may be integrated into a processing unit, or each unit may exist alone physically, or two or more than two units may be integrated into one unit. The integrated unit may be implemented in a form of hardware, or may be implemented in a form of a software functional unit.

If the integrated unit is implemented in the form of the software functional unit and is sold or used as an independent product, it may be stored in a computer readable storage dielectric. Based on such understanding, the technical solution provided by the present essentially or the part that contributes to prior art or the part of the technical solution can be embodied in the form of a software product, and the computer software product is stored in a storage dielectric, including instructions that can be used to make a computer device (which may be a personal computer, a server, or a network device, etc.) execute all or part of the steps of the method described in each embodiment of the present application. The foregoing storage dielectric includes a variety of media capable of storing program codes, such as a USB disk, a mobile hard disk, a read-only memory (ROM), a random access memory (RAM), a magnetic disk, an optical disk.

The foregoing descriptions are merely specific implementations of the present disclosure. The protection scope of the present application, however, is not limited thereto. Various equivalent modifications or replacements may be readily conceivable to any person skilled in the art within the technical scope disclosed in the present application, and such modifications or replacements shall fall within the protection scope of the present application. Therefore, the protection scope of this application shall be subject to the protection scope of the claims.

What is claimed is:

1. A fingerprint identification apparatus, wherein the fingerprint identification apparatus is configured to be disposed under a display screen of an electronic device, comprising:
   a sensor chip, comprising a light detecting array and a chip protection ring, wherein the chip protection ring is disposed around the light detecting array;
   a light shielding layer, formed on the light detecting array, wherein the light shielding layer is provided with a plurality of light passing apertures, and the light shielding layer covers an whole region of the light detecting array and at least covers a partial region of the chip protection ring; and
   a micro-lens array, disposed above the light shielding layer;

wherein the micro-lens array is configured to converge the fingerprint light signal, returned after reflection or scattering via a finger above the display screen, to the plurality of light passing apertures of the light shielding layer, and the fingerprint light signal is transmitted to the light detecting array through the plurality of light passing apertures of the light shielding layer for fingerprint identification.

2. The fingerprint identification apparatus according to claim 1, wherein the fingerprint identification apparatus further includes: a filter layer, disposed between the light shielding layer and the sensor chip, is configured to filter out a light signal in a non-target waveband and transmit a light signal in a target waveband, and the filter layer covers the whole region of the light detecting array and at least covers the partial region of the chip protection ring.

3. The fingerprint identification apparatus according to claim 2, wherein the fingerprint identification apparatus further comprises: a chip welding region, comprising a plurality of chip welding pads;
wherein the chip protection ring is a polygon ring-shaped structure, and the chip welding region is located in the chip protection ring and closer to a first side of the chip protection ring;
and the light shielding layer does not cover the chip welding region and the first side of the chip protection ring.

4. The fingerprint identification apparatus according to claim 3, wherein the chip protection ring is a quadrilateral ring-shaped structure, and the light shielding layer covers at least one side apart from the first side of the chip protection ring.

5. The fingerprint identification apparatus according to claim 3, wherein the filter layer does not cover the chip welding region and the first side of the chip protection ring.

6. The fingerprint identification apparatus according to claim 5, wherein the chip protection ring is a quadrilateral ring-shaped structure, and the filter layer covers at least one side apart from the first side of the chip protection ring.

7. The fingerprint identification apparatus according to claim 1, wherein the light shielding layer covers a partial region of a scribe line of the sensor chip.

8. The fingerprint identification apparatus according to claim 2, wherein the filter layer covers the partial region of the scribe line of the sensor chip.

9. The fingerprint identification apparatus according to claim 1, the light shielding layer is one of a plurality light shielding layers, and at least one light shielding layer of the plurality of light shielding layers covers the whole region of the light detecting array and at least covers the partial region of the chip protection ring.

10. The fingerprint identification apparatus according to claim 1, wherein the light shielding layer has a transmittance of less than 8% for visible light with a wavelength range from 400 nm to 600 nm.

11. The fingerprint identification apparatus according to claim 2, wherein the filter layer is a filter material film formed on the light detecting array, a thickness of the filter layer is between 1 μm to 10 μm, and the filter layer and the light detecting array are integrated in the sensor chip, and a wavelength range of a target band ranges from 400 μm to 650 μm.

12. The fingerprint identification apparatus according to claim 2, wherein the filter layer covers the whole region of the light detecting array, and a distance between a boundary of the filter layer and a boundary of the light detecting array is greater than 150 μm.

13. The fingerprint identification apparatus according to claim 2, wherein the filter layer comprises a plurality of oxide films, wherein a silicon oxide film and a titanic oxide film overlap in sequence to form the plurality of oxide films, or a silicon oxide film and a niobiun oxide film overlap in sequence to form the plurality of oxide films.

14. The fingerprint identification apparatus according to claim 2, wherein the fingerprint identification apparatus further comprises:
a surface blocking layer, formed on the light shielding layer and provided with an opening window, and the micro-lens array being disposed in the opening window;
and the surface blocking layer is configured to block a light signal around the micro-lens array from entering the light detecting array.

15. The fingerprint identification apparatus according to claim 14, wherein an edge of the surface blocking layer covers an edge of the light shielding layer and/or an edge of the filter layer.

16. The fingerprint identification apparatus according to claim 14, wherein the surface blocking layer has a transmittance of less than 8% for visible light with a wavelength range from 400 nm to 600 nm.

17. The fingerprint identification apparatus according to claim 2, wherein the fingerprint identification apparatus further comprises: a first dielectric layer and a second dielectric layer;
the first dielectric layer grows on a surface of the filter layer;
the light shielding layer grows on a surface of the first dielectric layer;
and the second dielectric layer grows on a surface of the light shielding layer and fills the plurality of light passing apertures of the light shielding layer.

18. The fingerprint identification apparatus according to claim 1, wherein an upper surface of each micro lens in the micro-lens array is a spherical surface or an aspherical surface.

19. The fingerprint identification apparatus according to claim 1, the fingerprint light signal is a vertical oriented light signal perpendicular to the display screen or a specific oriented light signal obliquely to the display screen.

20. An electronic device, wherein the electronic device comprises: a display screen, and a fingerprint identification apparatus, wherein the fingerprint identification apparatus is configured to be disposed under the display screen,
wherein the fingerprint identification apparatus comprises:
a sensor chip, comprising a light detecting array and a chip protection ring, wherein the chip protection ring is disposed around the light detecting array;
a light shielding layer, formed on the light detecting array, wherein the light shielding layer is provided with a plurality of light passing apertures, and the light shielding layer covers a whole region of the light detecting array and at least covers a partial region of the chip protection ring; and
a micro-lens array, disposed above the light shielding layer;
wherein the micro-lens array is configured to converge the fingerprint light signal, returned after reflection or scattering via a finger above the display screen, to the plurality of light passing apertures of the light shielding layer, and the fingerprint light signal is transmitted to the light detecting array through the plurality of light passing apertures of the light shielding layer for fingerprint identification;
wherein the display screen is an organic light-emitting diode display screen, and a light-emitting layer of the display screen includes a plurality of organic light-emitting diode light sources, wherein the fingerprint identification device adopts at least part of the organic light-emitting diode light sources as excitation light sources for fingerprint identification.

* * * * *